United States Patent
Eggers et al.

(10) Patent No.: US 6,888,284 B2
(45) Date of Patent: May 3, 2005

(54) STATOR

(75) Inventors: Wolf-Joachim Eggers, Karlsruhe (DE); Johannes Pfetzer, Buehl (DE); Guenther Riehl, Buehl (DE); Matthias Schmitz, Gifhorn (DE)

(73) Assignee: Robert Bosch GmbH, Stuttgart (DE)

( * ) Notice: Subject to any disclaimer, the term of this patent is extended or adjusted under 35 U.S.C. 154(b) by 410 days.

(21) Appl. No.: 10/049,711

(22) PCT Filed: May 23, 2001

(86) PCT No.: PCT/DE01/01933

§ 371 (c)(1),
(2), (4) Date: Apr. 29, 2002

(87) PCT Pub. No.: WO01/91266

PCT Pub. Date: Nov. 29, 2001

(65) Prior Publication Data

US 2002/0135259 A1 Sep. 26, 2002

(30) Foreign Application Priority Data

May 25, 2000 (DE) .......................... 100 26 003

(51) Int. Cl.⁷ .............................. H02K 1/18; H02K 3/30
(52) U.S. Cl. ......................................... 310/218; 310/43
(58) Field of Search ............................... 310/216–218, 310/254, 43, 87, 194

(56) References Cited

U.S. PATENT DOCUMENTS

| | | | |
|---|---|---|---|
| 3,827,141 A | 8/1974 | Hallerback | 310/216 |
| 3,914,859 A * | 10/1975 | Pierson | 29/596 |
| 4,131,988 A * | 1/1979 | Finegold | 29/596 |
| 4,689,023 A | 8/1987 | Strong, III et al. | 310/216 |
| 5,918,360 A * | 7/1999 | Forbes et al. | 29/596 |
| 6,515,396 B1 * | 2/2003 | Fritzsche | 310/216 |

FOREIGN PATENT DOCUMENTS

| | | |
|---|---|---|
| DE | 39 05 997 A | 8/1990 |
| EP | 0 880 215 A2 | 11/1998 |
| EP | 0 952658 A | 10/1999 |
| GB | 966 156 A | 8/1964 |

OTHER PUBLICATIONS

Patent Abstracts of Japan vol. 008, No. 226 (E–272, Oct. 17, 1984 & JP 59 106847, Jun. 20, 1984.

* cited by examiner

Primary Examiner—Tran Nguyen
(74) Attorney, Agent, or Firm—Michael J. Striker

(57) ABSTRACT

A stator according to the prior art is formed out of a laminated stack that is insulated by means of a plastic coating, and stator pole teeth are connected to each other in permeable fashion.

A stator (20) according to the invention comprises separate permeable stacks of individual laminations (16) that are held together by means of a plastic coating.

The return ring (30) is joined with play on the stack of individual laminations (18, 16, 1) and installed on the stack via bayonet coupling.

13 Claims, 6 Drawing Sheets

STATOR

RELATED ART

The invention is based on a stator according to the definition of the species in Claim 1.

A stator that has a plastic coating was made known previously in EP 0 880 215 A2. The plastic coating is applied by means of injection molding and, simultaneously, receptacles can be formed as well that simplify the installation of a bearing or a connector.

The individual laminations of the stator must be joined into one laminated stack before injection molding, however. Furthermore, the laminations must be pressed together on the respective stator pole teeth during injection molding so that no gaps form between individual laminations into which the plastic can enter. Additionally, stator pole teeth are connected to each other in permeable fashion.

ADVANTAGES OF THE INVENTION

In contrast, the stator according to the invention having the characteristic features of claim 1 has the advantage that the manufacture of a stator is made easier in simple fashion, by way of which the stator of an electric motor can be assembled more easily, quickly, and favorably.

Advantageous further developments and improvements of the stator named in claim 1 are possible due to the measures listed in the dependent claims.

For the installation of the stacks of individual laminations on the core ring, it is advantageous that the core ring have a hook-shaped projection for each stack of individual laminations that at least partially encompasses the stack of individual laminations and forms a positive connection.

For the installation of the stacks of individual laminations on the core ring, it is advantageous that the core ring have a protuberance that can be guided [word missing] a groove of the stack of individual laminations, because the stack of individual laminations can then be attached in centered fashion.

It is advantageous to produce the plastic coating of the stator by means of injection molding.

For the installation of coils on the at least one lamination, it is advantageous that the lamination have projections extending radially outward, onto which the coils can be slid.

An advantageous embodiment of the invention is given by the fact that a coil form is integrally molded around the projections of the laminations, because this simplifies the installation of coils on the stator.

For the process of winding of a coil on the coil form, it is advantageous if the plastic coating have at least one winding support point that simplifies the gripping of the stator, and if a lowermost winding plane of the coil form only touches the coil form, because the coil form is then freely accessible for the winding process, and a winding head of a winding machine can encircle the coil form freely.

If the coil form or the plastic coating also has a receptacle, furthermore, an insulation displacement connection having a coil wire and external connections can be produced in advantageous fashion.

It is advantageous to design the projections of the lamination so that an external member can be slid onto the lamination and held by the projections by means of a non-positive connection or by means of a bayonet coupling.

The formation of a laminated stack out of individual laminations can furthermore be advantageous.

BRIEF DESCRIPTION OF THE DRAWING

Exemplary embodiments of the invention are shown in the drawing in simplified form and described in greater detail in the following description.

DETAILED DESCRIPTION OF THE EXEMPLARY EMBODIMENTS

Figure 1:
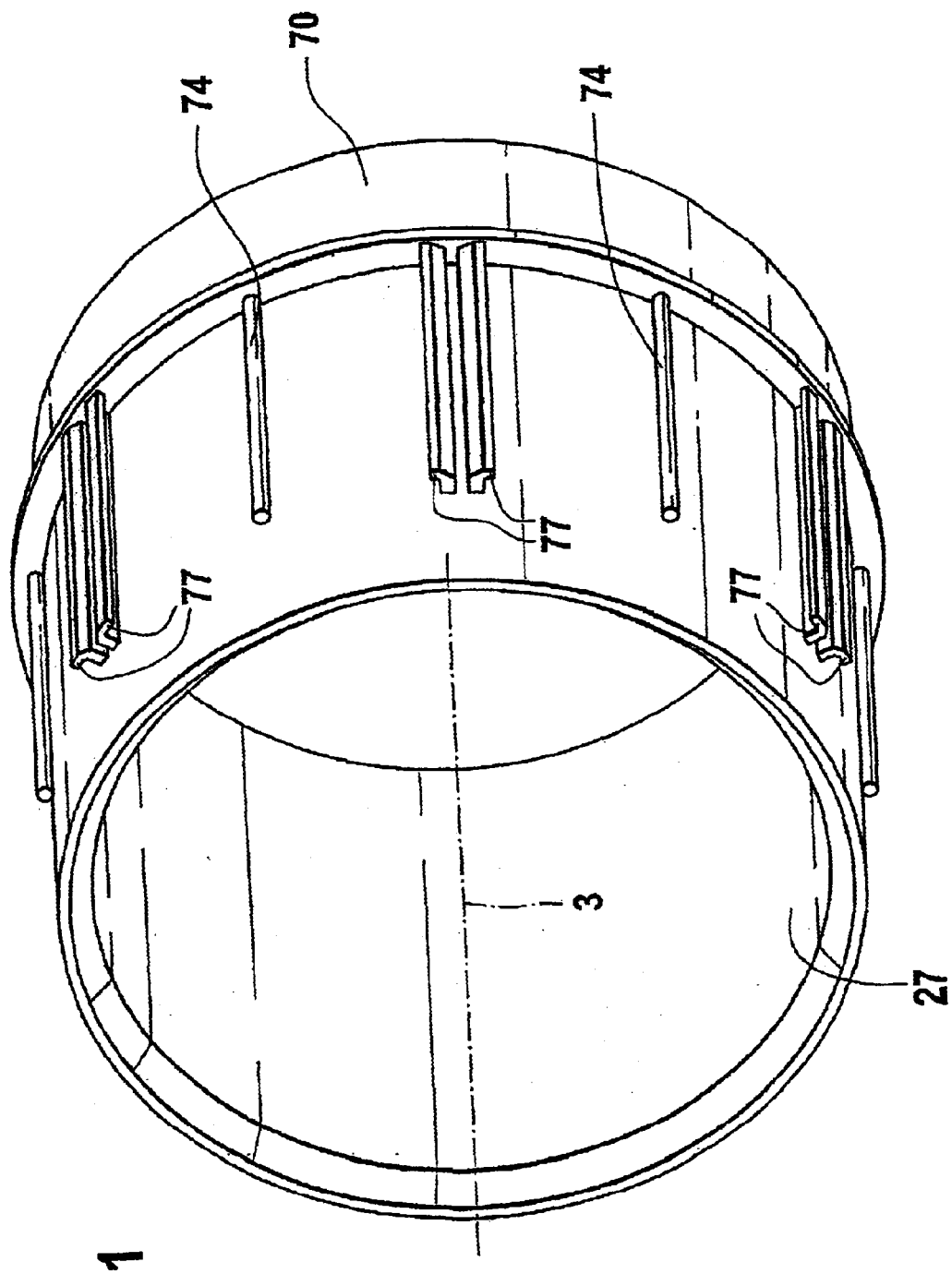
FIG. 1 shows a core ring.

FIG. 1 shows a core ring 70. The core ring 70 has at least one hook-shaped projection 77 for each stack of individual laminations 16 (FIG. 2) that extends in the direction of a centerline 3 on an outer surface of the core ring 70. The projection 77 at least partially encompasses a foot of a stack of individual laminations 16 and forms a positive connection. In this example there are two projections 77 for each stack of individual laminations 16.

The core ring 70 has at least one protuberance 74 between these two projections that extends in the direction of the centerline 3 on the outer surface of the core ring 70 and in which a groove 58 of the stack of individual laminations 16 catches.

The core ring forms a watertight inner channel 27 through which a medium, e.g., a liquid medium, can be directed.

Figure 2:
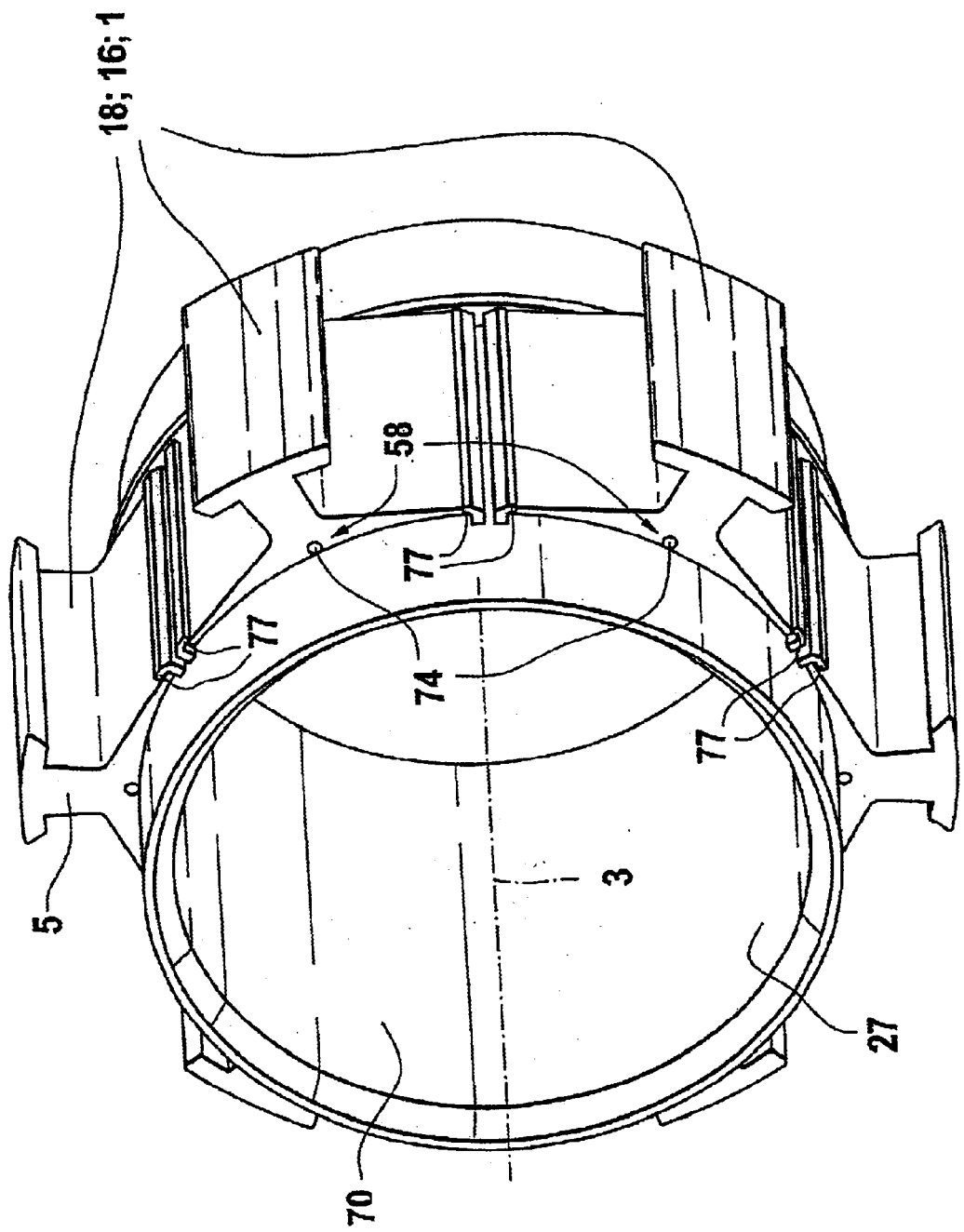
FIG. 2 shows a core ring having laminations.

FIG. 2 shows laminations 1 in the form of the stack of individual laminations 16 or a lamination 18 that are located on the core ring 70. The same reference numerals are used in the following figures as in the preceding figures for identical or equally-acting parts. The projections 77 and the stack of individual laminations are shaped in relation to each other in such a fashion, e.g., the projections 77 have radially different heights, so that the laminations can be installed in only one certain fashion. After the application of a plastic coating 22, by means of injection molding, for example, the stack of individual laminations 16 is held together by means of this partially present plastic coating 22. Preassembled coils can be slid onto the stator pole teeth.

One component produced in this fashion is a stator for a fluid pump, for example, wherein the projections 5 form stator pole teeth.

Lower electrical losses during the operation of a pump result due to the fact that the stator pole teeth are designed separate from each other and permeable.

Figure 3:
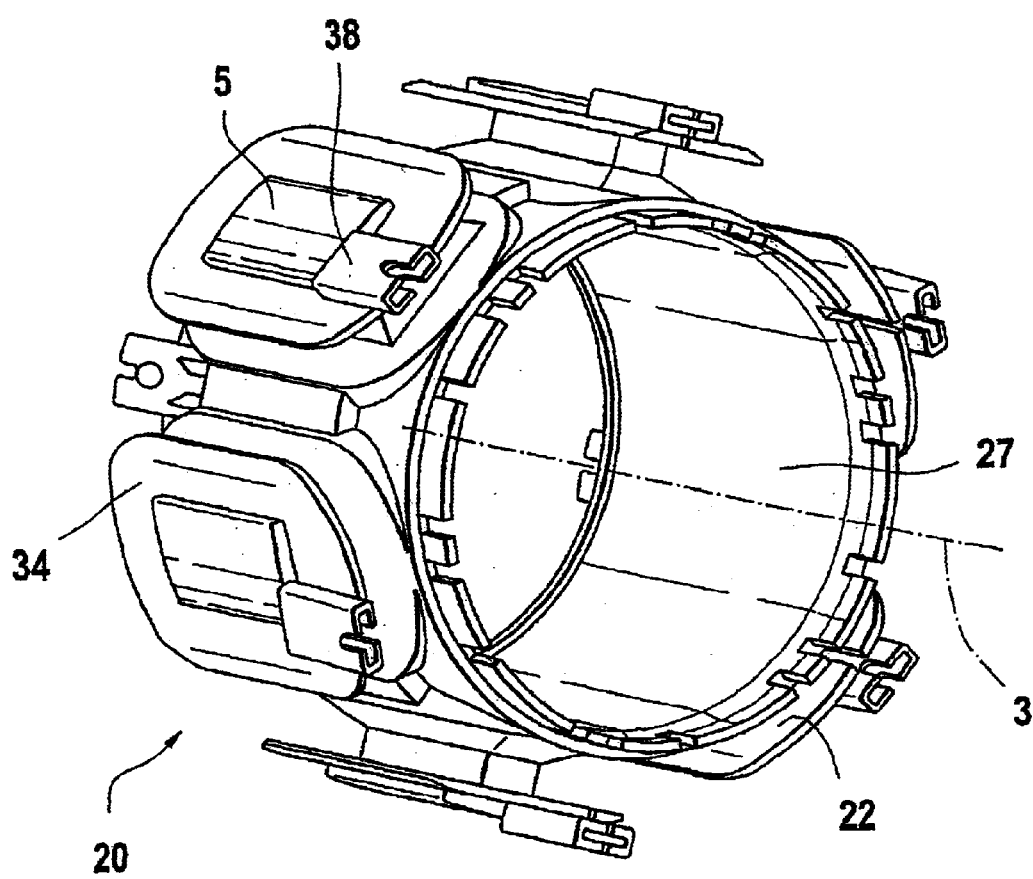
FIG. 3 shows laminations having a plastic coating and coil forms.

FIG. 3 shows a further development of a laminated stack 18, having a plastic coating 22 from FIG. 2.

A coil form 34 has been integrally molded around the projections 5, which form stator pole teeth. These can be produced in one working step using the application of the plastic coating 22. A coil 45 (FIG. 5) of electrically conductive wire can be wound on the coil form 34. This coil 45 encloses the projection 5 and serves to magnetically excite a rotor (not shown). A connection must be produced for the external electrical power supply of the coil 45. This takes place, for example, by means of a receptacle 38, in which an insulation displacement connection between one end of coil wire and an external or further electrical connecting lead can be produced. This mechanical connecting is very simple and rapid compared to a soldering for the connection of electrical leads.

Figure 4A:
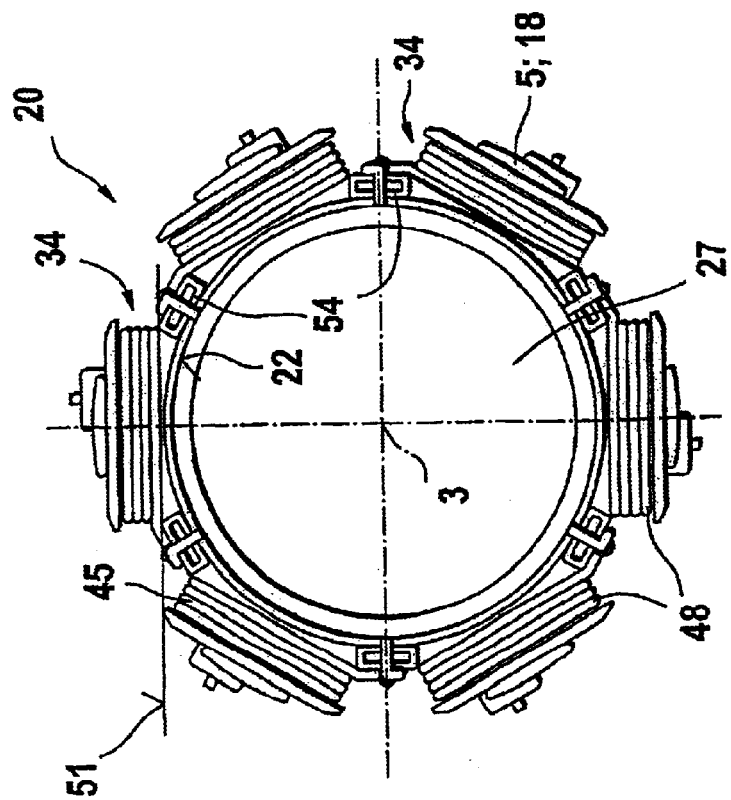
FIG. 4 shows a stator according to the invention.
Figure 4B:
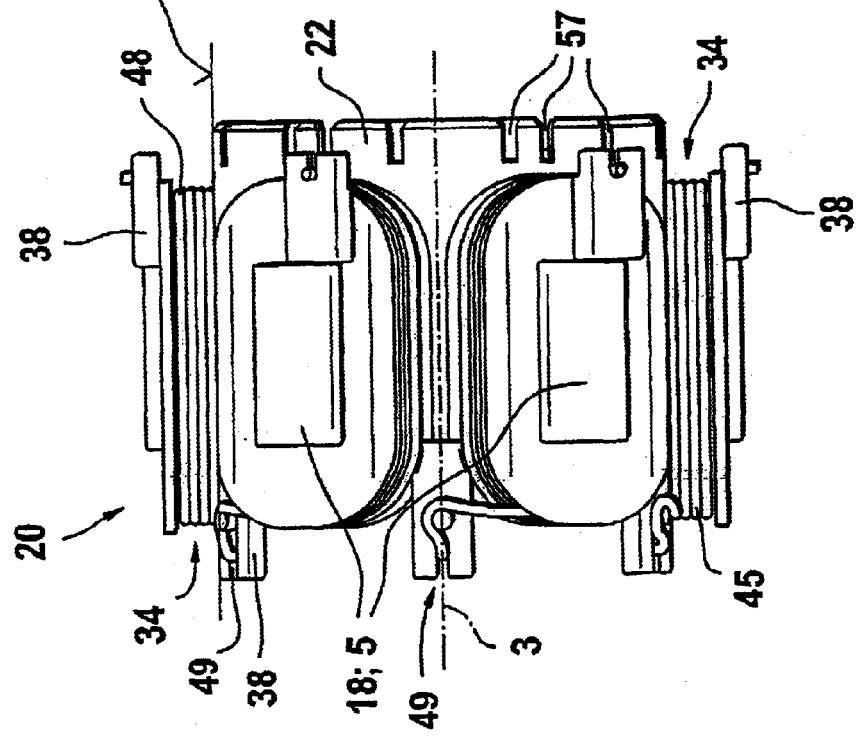

FIG. 4 shows a stator 20 according to the invention. A winding 45 has been wound on the coil form 34. The coil form 34 has a lowermost winding plane 51 that is indicated by a line that is closest to the centerline 3. The lowermost winding plane 51 touches the plastic coating 22 only at the one respective coil form 34. The coil form 34 is therefore freely accessible for the winding procedure, and a winding head of a winding machine can encircle the coil form 34 freely.

On the plastic coating 22 or, as in this exemplary embodiment, the coil form 34 has a winding support point 54 for better gripping of the lamination 18 during the winding procedure. In this example, the receptacle 38 serves as winding support point 54.

One end of a coil wire 48 of the winding 45 is located in the receptacle and squeezed in a slit 49, for example.

Figure 5:
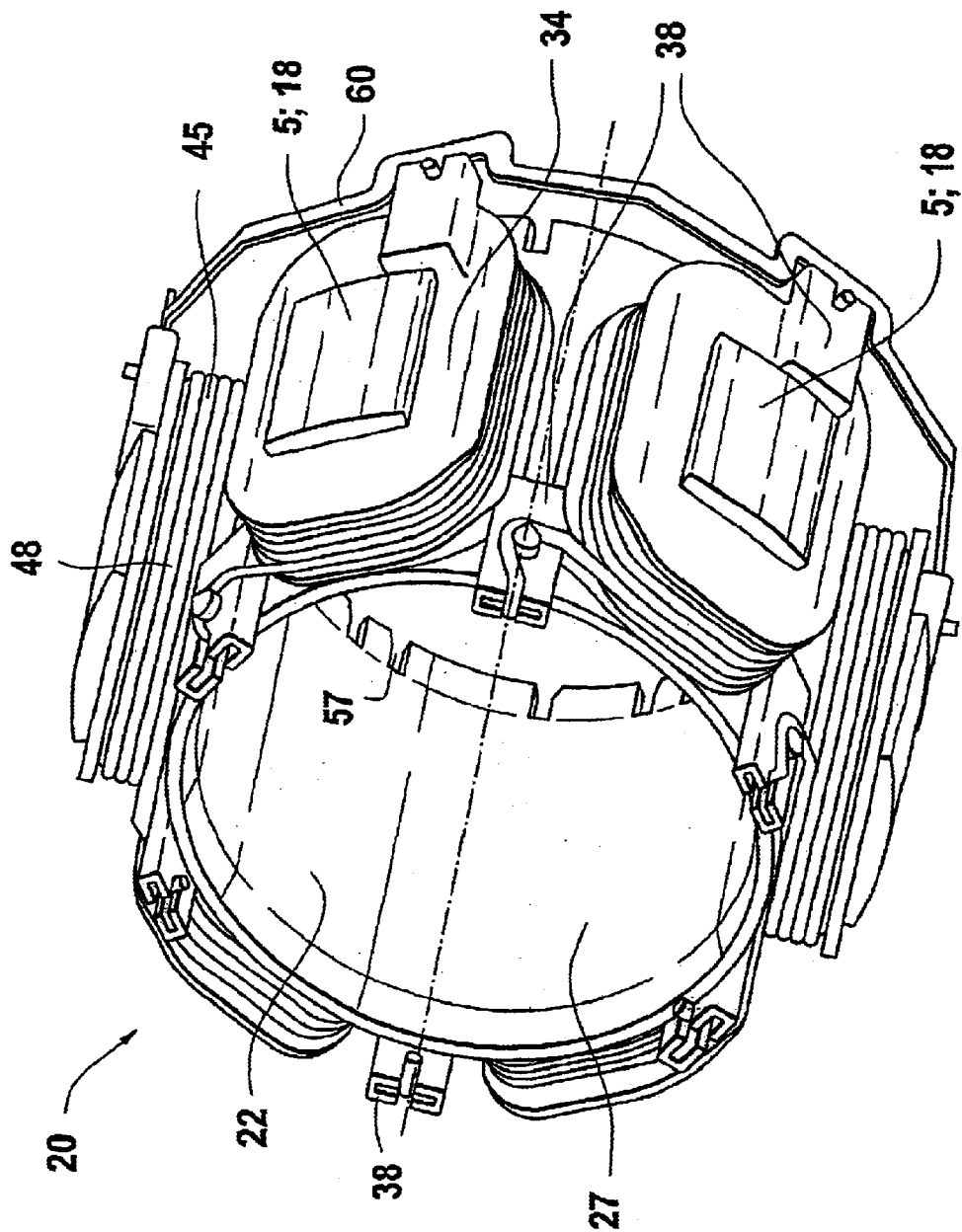
FIG. 5 shows a stator according to the invention having a punched grid.

FIG. 5 shows a stator 20 according to the invention according to FIG. 5 having a punched grid 60 that extends from one receptacle 38 to the other receptacles 38 and forms a neutral point of the windings 45.

Figure 6:
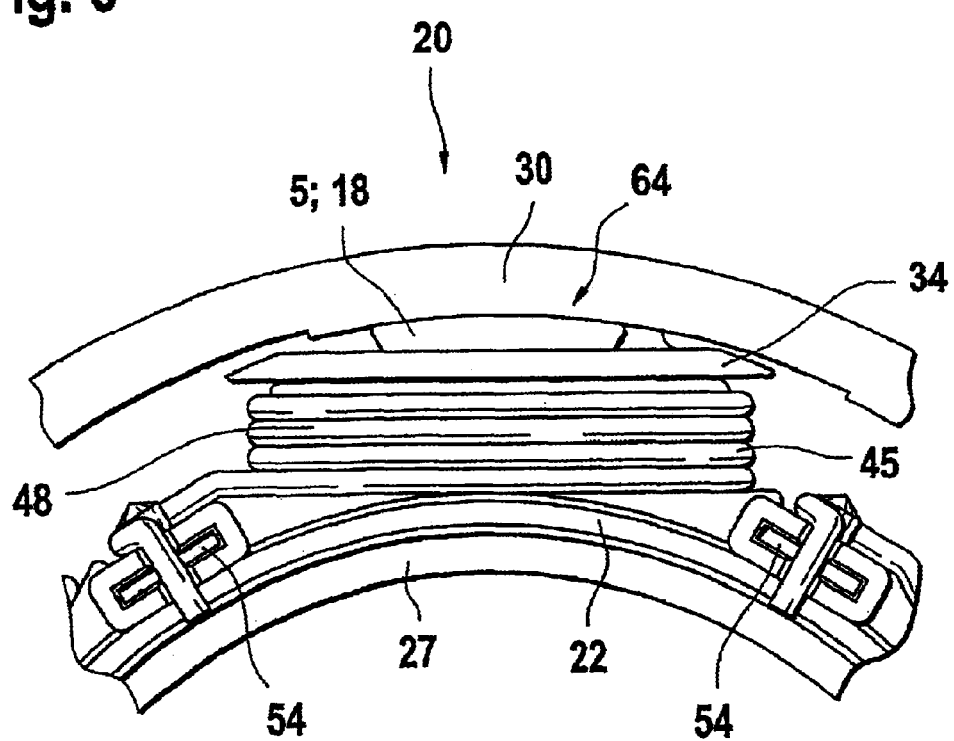
FIG. 6 shows a partial representation of an arrangement of an external member on a projection of the lamination.

FIG. 6 shows an annular external member 30 that can be slid onto a stack of individual laminations 16 or a laminated stack 18. The projections 5 thereby extend in the radial direction so far that the external member is held on the laminated stack by means of non-positive engagement. This takes place, for example, because the projection 5 is displaced relative to the centerline 3, and the external member 30 can therefore be screwed onto a conical surface.

The external member 30 forms a magnetic return element or a part of the motor housing. The external member 30 can also be formed out of individual laminations.

What is claimed is:

1. A stator (20) comprising at least one stack of individual laminations (16) that comprises at least one lamination (1), and an at least partially present plastic coating (22), wherein the stator (20) comprises at least one corn ring (70) that forms a watertight inner channel (27) and extends along a centerline (3), wherein at least one stack of individual laminations (16) is located on the core ring (70), and the at least one stack of individual laminations (16) is held together by means of the plastic coating (22), wherein the core ring (70) is made of plastic and has at least one hook-shaped protection (77) for each stack of individual lamination (16) that extends in the direction of the centerline (3) of the stator (20) on an outer surface of the core ring (70), and the at least one hook-shaped projection (77) at least partially encompasses the stack of individual laminations (16) and forms a positive connection.

2. A stator according to claim 1, wherein the plastic coating (22) of the stator (20) is produced by means of injection molding.

3. A stator according to claim 1, wherein at least one stack of individual laminations (16) has at least one projection (5) extending radially outward, on which an electrical winding (45) is located.

4. A stator according to claim 3, wherein a coil form (34) is integrally molded onto at least one projection (5) of the lamination (1).

5. A stator according to claim 4, wherein the electrical winding (45) is located on the coil form (34), wherein the electrical winding (45) is composed of at least one coil wire, and wherein at least one receptacle (38) is located on the plastic coating (22) that serves as an insulation displacement connection having a coil wire (48).

6. A stator according to claim 5, wherein the at least one receptacle (38) is located on the coil form (34).

7. A stator according to claim 4, wherein a winding is wound in at least one plane on the coil form (34), wherein there is a lowermost winding plane (51) of a coil form (34) that is closest to the centerline (3), and wherein the lowermost winding plane (51) touches the plastic coating (22) only at the respective coil form (34).

8. A stator according to claim 4, wherein the coil form (34) has at least one winding support point (54) for a winding procedure of the coil form (34) having a winding (45).

9. A stator according to claim 3, wherein an external member (30) is slid onto the projections (5) of the stack of individual laminations (18).

10. A stator according to claim 9, wherein the external member (30) is formed out of individual sheet metal layers.

11. A stator according to claim 9, wherein the external member (30) forms a bayonet coupling (64) with the at least one stack of individual laminations (18).

12. A stator according to claim 1 wherein the stack of individual laminations (18) form a laminated stack.

13. A stator (20) comprising at least one stack of individual laminations (16) that comprises at least one lamination (1), and an at least partially present plastic coating (22), wherein the stator (20) comprises at least one core ring (70) that forms a watertight inner channel (27) and extends along a centerline (3), wherein at least one stack of individual laminations (16) is located on the core ring (70), and the at least one stack of individual laminations (16) is held together by means of the plastic coating (22), wherein the core ring (70) has at least one protuberance (74) that extends in the direction of the centerline (3) on an outer surface of the core ring (70), and the protuberance (74) catches in a groove (58) of the stack of individual laminations (16).

* * * * *